United States Patent
Lee (10) Patent No.: US 10,170,163 B2
(45) Date of Patent: Jan. 1, 2019

(54) DEVICE AND METHOD FOR GENERATING INHERENT INFORMATION OF INTEGRATED CIRCUITS FOR AUTHENTICATION PURPOSE

(71) Applicant: MACRONIX INTERNATIONAL CO., LTD., Hsinchu (TW)

(72) Inventor: Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/454,087

(22) Filed: Mar. 9, 2017

(65) Prior Publication Data

US 2018/0261262 A1 Sep. 13, 2018

(51) Int. Cl.
*G11C 7/06* (2006.01)

(52) U.S. Cl.
CPC .................... *G11C 7/062* (2013.01)

(58) Field of Classification Search
CPC ......... G11C 7/062; G11C 7/1006; G11C 7/14; G11C 7/22; G11C 7/1051
See application file for complete search history.

(56) References Cited

U.S. PATENT DOCUMENTS

| 8,130,955 | B2 | 3/2012 | Trichina et al. | |
|---|---|---|---|---|
| 8,290,150 | B2 | 10/2012 | Erhart et al. | |
| 8,386,990 | B1 | 2/2013 | Trimberger et al. | |
| 9,436,845 | B2 | 9/2016 | Iyer et al. | |
| 2004/0190349 | A1* | 9/2004 | Schreck | G11C 7/12 365/189.07 |
| 2005/0237798 | A1* | 10/2005 | Urabe | G11C 16/24 365/185.03 |
| 2013/0155761 | A1 | 6/2013 | Aoki | |
| 2014/0126306 | A1 | 5/2014 | Otterstedt et al. | |
| 2016/0148666 | A1 | 5/2016 | Rosenberg et al. | |

OTHER PUBLICATIONS

TIPO Office Action dated Nov. 15, 2017 in Taiwan application (No. 106105892).
TIPO Office Action dated Feb. 5, 2018 in Taiwan application (No. 106105892).

* cited by examiner

*Primary Examiner* — Harry W Byrne
*Assistant Examiner* — Sultana Begum
(74) *Attorney, Agent, or Firm* — McClure, Qualey & Rodack, LLP (57) ABSTRACT

An inherent information generating device adapted to an integrated circuit includes a plurality of pairs of source memory cells and a comparison circuit. One of the pairs of source memory cells includes a first source memory cell with a first electrical parameter value and a second source memory cell with a second electrical parameter value. The comparison circuit, coupled to the pairs of source memory cells and configured to generate inherent information of the integrated circuit, includes a first comparator. The first comparator is coupled to the first and second source memory cells, and is configured to compare the first electrical parameter value with the second electrical parameter value, and generate the bit value of a first bit of the inherent information according to the comparison result.

18 Claims, 6 Drawing Sheets

DEVICE AND METHOD FOR GENERATING INHERENT INFORMATION OF INTEGRATED CIRCUITS FOR AUTHENTICATION PURPOSE

TECHNICAL FIELD

The present disclosure relates to devices and methods for generating inherent information of an integrated circuit.

BACKGROUND

In order to ensure the security of data exchange or control operations, many applications usually need to utilize the inherent information of an integrated circuit (e.g., a chip) to identify the authentication of the operation. The inherent information of the integrated circuit can be used as an identifier of the integrated circuit, and can be used in data encryption for generating encryption key.

Some existing methods for generating the inherent information of the integrated circuit are provided, such as external managed code generation. However, the inherent information generated in this manner can be extracted/trace-back through scanning electron microscopy (SEM) or transmission electron microscopy (TEM) from the structural change of memory devices such as poly-fuse or oxide anti-fuse, resulting in a risk of leaking the inherent information.

SUMMARY

The present disclosure relates to devices and methods for generating inherent information of an integrated circuit. Each bit value of the inherent information can be generated by comparing the electrical parameter values of two source memory cells, so that the generated inherent information is unique, difficult to predict and stable.

According to an embodiment of the present disclosure, an inherent information generating device adapted to an integrated circuit is provided. The inherent information generating device includes a plurality of pairs of source memory cells and a comparison circuit. One of the pairs of source memory cells includes a first source memory cell with a first electrical parameter value and a second source memory cell with a second electrical parameter value. The comparison circuit, coupled to the pairs of source memory cells and configured to generate inherent information of the integrated circuit, includes a first comparator. The first comparator is coupled to the first and second source memory cells, and is configured to compare the first electrical parameter value with the second electrical parameter value, and generate the bit value of a first bit of the inherent information according to the comparison result.

According to an embodiment of the present disclosure, an inherent information generating method adapted to an integrated circuit is provided. The inherent information generating method includes steps of: providing a plurality of pairs of source memory cells, wherein one of the pairs of source memory cells comprises a first source memory cell with a first electrical parameter value and a second source memory cell with a second electrical parameter value; comparing the first electrical parameter value with the second electrical parameter value, and generating the bit value of a first bit of the inherent information according to the comparison result.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In the application, embodiments of the disclosure are described in detail with reference to the accompanying drawings. However, not all embodiments are depicted in these drawings. The disclosure may be implemented in different variations and is not limited to the disclosed embodiments. Further, the embodiments provided in the disclosure fully meet legal application requirements. The same reference denotations in the drawings represent identical or similar elements.

Figure 1:
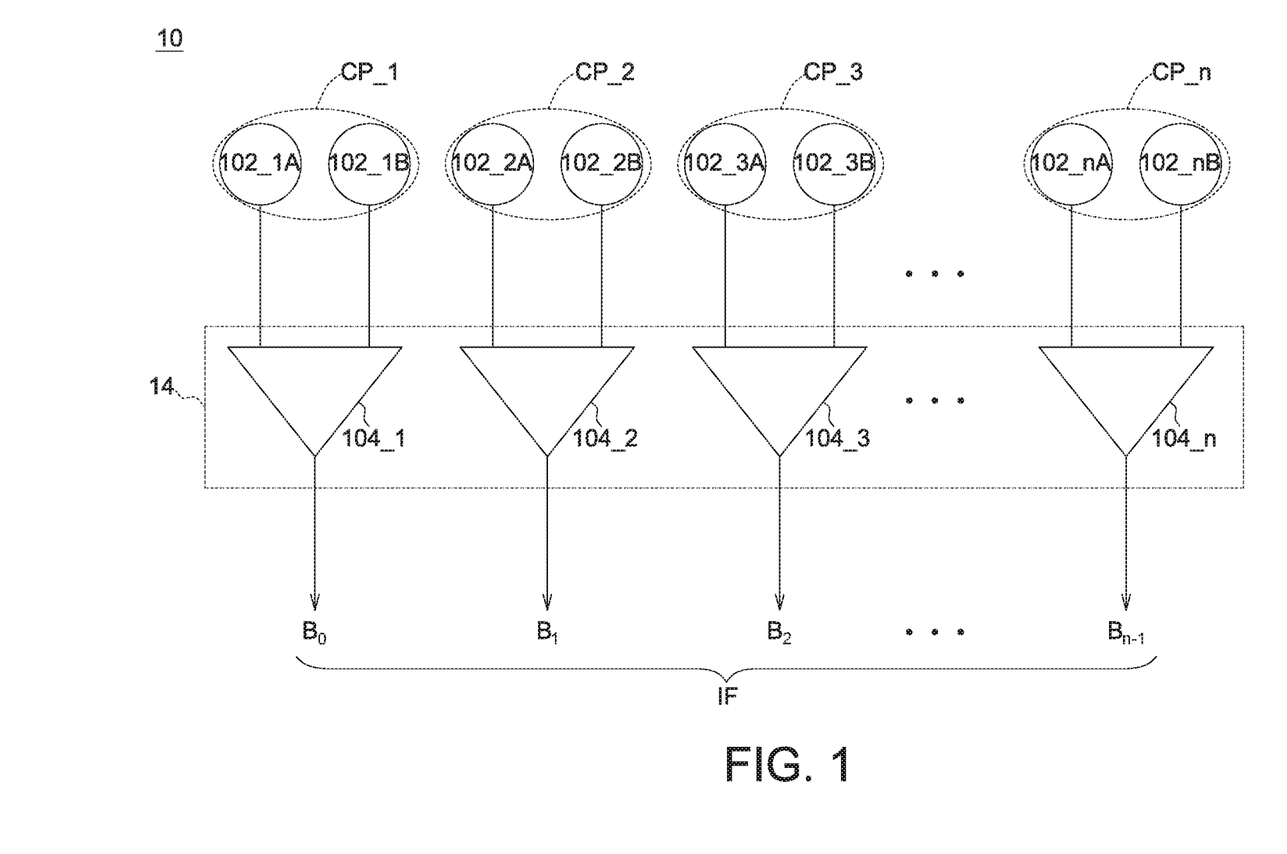
FIG. 1 illustrates a block diagram of an inherent information generating device according to an embodiment of the present disclosure.

FIG. 1 illustrates a block diagram of an inherent information generating device 10 according to an embodiment of the present disclosure. The inherent information generating device 10 is suitable for use in an integrated circuit (e.g., a chip). The inherent information generating device 10 can be, for example, a Physical Unclonable Function (PUF) circuit, which may generate the inherent information IF of the integrated circuit. For example, the inherent information IF of the integrated circuit is a codeword of a set of n bits $B_0$-$B_{n-1}$. The inherent information IF can be used as an identity code of the integrated circuit, and can also be used for the identification of the encryption/authentication operation. For example, the inherent information IF may be provided to an encoder so that the encoder generates a key for data encryption processing.

The inherent information generating device 10 includes a plurality of pairs of source memory cells CP_1-CP_n and a comparison circuit 14. The pairs of source memory cells CP_1-CP_n are respectively coupled to comparators 104_1-104_n in the comparison circuit 14.

Each of the pairs of source memory cells CP_1-CP_n includes two source memory cells. In the context of the present disclosure, a source memory cell refers to a memory cell used in the generation of the inherent information IF.

As shown in FIG. 1, the pair of source memory cells CP_1 includes the source memory cells 102_1A and 102_1B; the pair of source memory cells CP_2 includes the source memory cells 102_2A and 102_2B; the pair of source memory cells CP_3 includes the source memory cells 102_3A and 102_3B; the pair of source memory cells CP_n includes the source memory cells 102_nA and 102_nB. The source memory cells in different pairs may be the same as or different from each other. For example, a source memory cell may connect to both the comparators 104_1 and 104_2, and such a source memory cell is not only used as the source memory cell 102_1A (or 102_1B) of the pair of source memory cells CP_1 but also the source memory cell 102_2A (or 102_2B) of the pair of source memory cells CP_2.

In accordance with embodiments of the present disclosure, each of the comparators 104_1-104_n compares the electrical parameter values from two source memory cells coupled thereto, and generates the respective bits of the inherent information IF according to the comparison results. As shown in FIG. 1, the source memory cells 102_1A and 102_1B in the pair of source memory cells CP_1 are coupled to the comparator 1041, and the comparator 104_1 compares the electrical parameter values from the source memory cells 102_1A and 102_1B to generate the bit value of the bit $B_0$ of the intrinsic information IF according to the comparison result. For example, when the comparison result shows that the electrical parameter value of the source memory cell 102_1A is larger than the electrical parameter value of the source memory cell 102_1B, the bit value of the bit $B_0$ will be set to "1" (or "0"); when the comparison result shows that the electrical parameter value of the source memory cell 102_1A is less than the electrical parameter value of the source memory cell 102_1B, the bit value of the bit $B_0$ will be set to "0" (or "1").

The value of the electrical parameter of the source memory cell depends on the type of memory. For example, the electrical parameter value can be the threshold voltage (Vt) of floating gate memory, the resistance of resistive-change-transition metal-oxide memory, the resistance of phase change memory, or the capacitance of ferroelectric memory.

In accordance with embodiments of the present disclosure, since the electrical parameter values of the source memory cells are generally randomly distributed, the results of comparing the electrical parameter values of two source memory cells are also random and difficult to predict. With the characteristic of randomness, the resulted code of the inherent information IF is unique and unpredictable from chip to chip, and is suitable for security and other applications.

Moreover, even though the electrical parameter value of the source memory cell may be a function of an external condition (e.g., temperature, bias voltage), such correlation is homogeneous across all the source memory cells and thus the relation between any two source memory cells in the array may stay in the trend. For example, the difference between the electrical parameter values of two source memory cells may be reduced when the temperature increases; however, this will not change the relative magnitudes between the electrical parameter values of the two memory cells. Thus, the bit values generated by comparing the electrical parameter values of two source memory cells are stable and do not vary with environmental factors.

Figure 2:
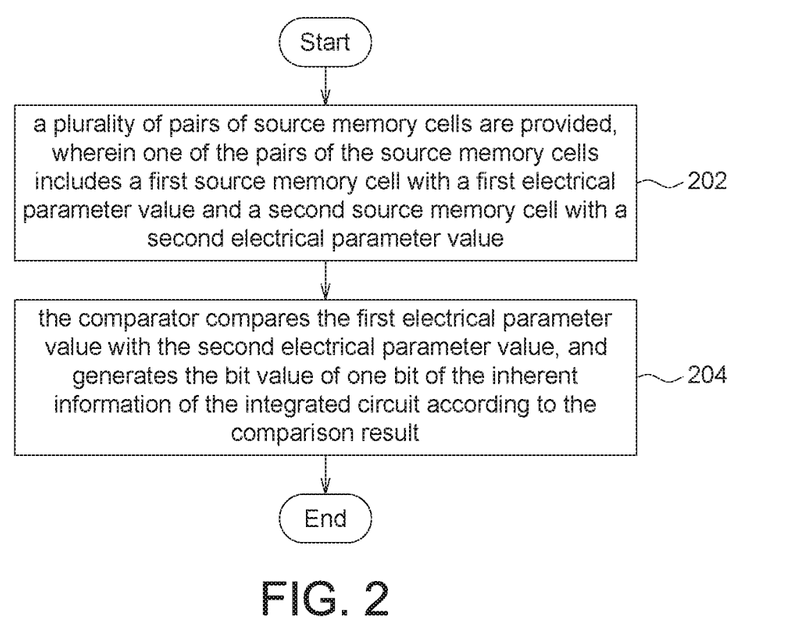
FIG. 2 illustrates a flowchart of a method for generating the inherent information according to an embodiment of the present disclosure.

FIG. 2 illustrates a flowchart of a method for generating the inherent information according to an embodiment of the present disclosure.

At step 202, a plurality of pairs of source memory cells are provided; one of the pairs of the source memory cells includes a first source memory cell with a first electrical parameter value and a second source memory cell with a second electrical parameter value.

The first and second electrical parameter values can be threshold voltage values, resistance values, capacitance values or any other physical values, depending on the type of first and second source memory cells.

At step 204, the comparator compares the first electrical parameter value with the second electrical parameter value, and generates the bit value of one bit of the inherent information of the integrated circuit according to the comparison result.

Taking the FIG. 1 as an example, the comparator 104_1 sets the bit value of the bit $B_0$ of the intrinsic information IF to "1" (or "0") when the electrical parameter value from the source memory cell 102_1A is larger than the electrical parameter value from the source memory cell 102_1B, and sets the bit value of the bit $B_0$ of the intrinsic information IF to "0" (or "1") when the electrical parameter value from the source memory cell 102_1A is less than the electrical parameter value from the source memory cell 102_1B; likewise, the comparator 104_2 sets the bit value of the bit $B_1$ of the intrinsic information IF to "1" (or "0") when the electrical parameter value from the source memory cell 102_2A is larger than the electrical parameter value from the source memory cell 102_2B, and sets the bit value of the bit $B_1$ of the intrinsic information IF to "1" (or "0") when the electrical parameter value from the source memory cell 102_2A is less than the electrical parameter value from the source memory cell 102_2B.

In an embodiment, the first source memory cell and the second source memory cell are in an initial state. The initial state of a source memory cell refers to a state that the source memory cell has not been programmed or erased. That is, the electrical parameter value presented by the source memory cell depends on the manufacturing process of the integrated circuit.

In another embodiment, the first source memory cell and the second source memory cell are in a programmed state. The programmed state of a source memory cell refers to a state that the source memory cell has been processed by a programming operation. Even under the same programming operation, the electrical parameter value of each source memory cell will move to a similar but not identical level (i.e., never two cells with the same electrical parameter value). Therefore, the inherent information generating device can still generate unique and unpredictable inherent information based on the aforementioned mechanism.

Figure 3:
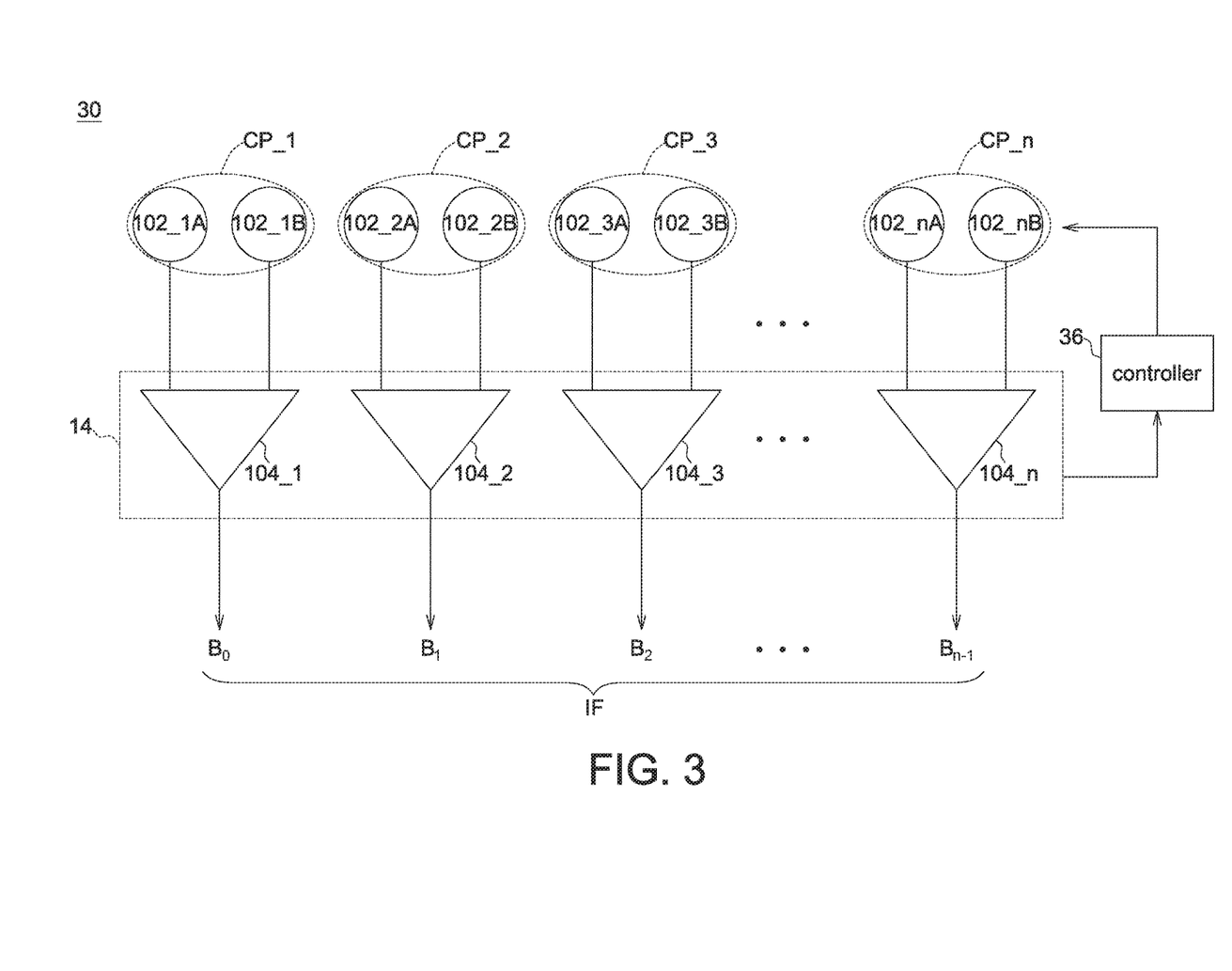
FIG. 3 illustrates a block diagram of an inherent information generating device according to another embodiment of the present disclosure.

FIG. 3 illustrates a block diagram of an inherent information generating device 30 according to another embodiment of the present disclosure. Compared to the inherent information generating device 10, the inherent information generating device 30 in this embodiment further includes a controller 36.

The controller 36 is a memory controller for example, which can perform programming operations on the source memory cells to increase the difference between the electrical parameter values of two source memory cells in a pair of source memory cells.

For example, if the comparator 104_1 determines that the electrical parameter value (e.g., x k-ohm) of the source memory cell 102_1A is larger than the electrical parameter value (e.g., y k-ohm, y<x) of the source memory cell 102_1B, the controller 36 may program at least one of the first and second source memory cells to increase the difference between the electrical parameter values of these two source memory cells 102_1A and 102_1B.

For example, the controller 36 can only program the source memory cell 102_1A to increase its electrical parameter value. Or, the controller 36 can only program the source memory cell 102_1B to decrease its electrical parameter value, or program both the source memory cells 102_1A and 102_1B to increase the electrical parameter value of the source memory cell 102_1A and decrease the electrical parameter value of the source memory cell 102_1B.

Figure 4:
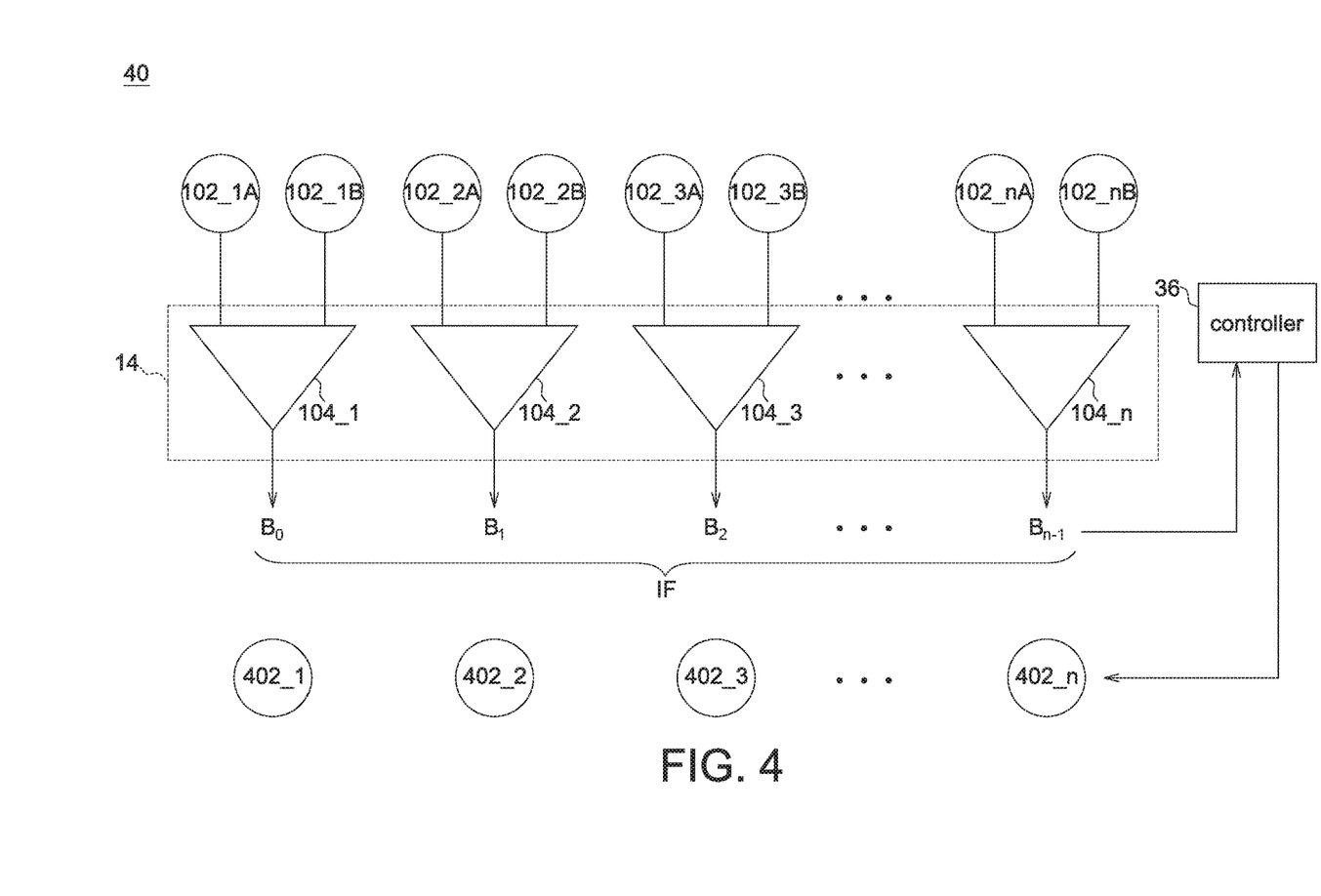
FIG. 4 illustrates a block diagram of an inherent information generating device according to another embodiment of the present disclosure.

FIG. 4 illustrates a block diagram of an inherent information generating device 40 according to another embodiment of the present disclosure. In this embodiment, the controller 36 may write the inherent information IF generated from the comparison circuit 14 into a set of memory cells 402_1-402_n (output memory cells), so that a backend circuit (e.g., a sensing amplifier) can directly access the inherent information IF from the memory cells 402_1-402_n.

For example, when the comparator 104_1 determines that the electrical parameter value of the source memory cell 102_1A is larger than the electrical parameter value of the source memory cell 102_1B, the controller 36 writes a bit value "1" of the bit $B_0$ into the memory cell 402_1; when the comparator 104_1 determines that the electrical parameter value of the source memory cell 102_1A is less than the electrical parameter value of the source memory cell 102_1B, the controller 36 writes a bit value "0" of the bit $B_0$ into the memory cell 402_1.

Figure 5:
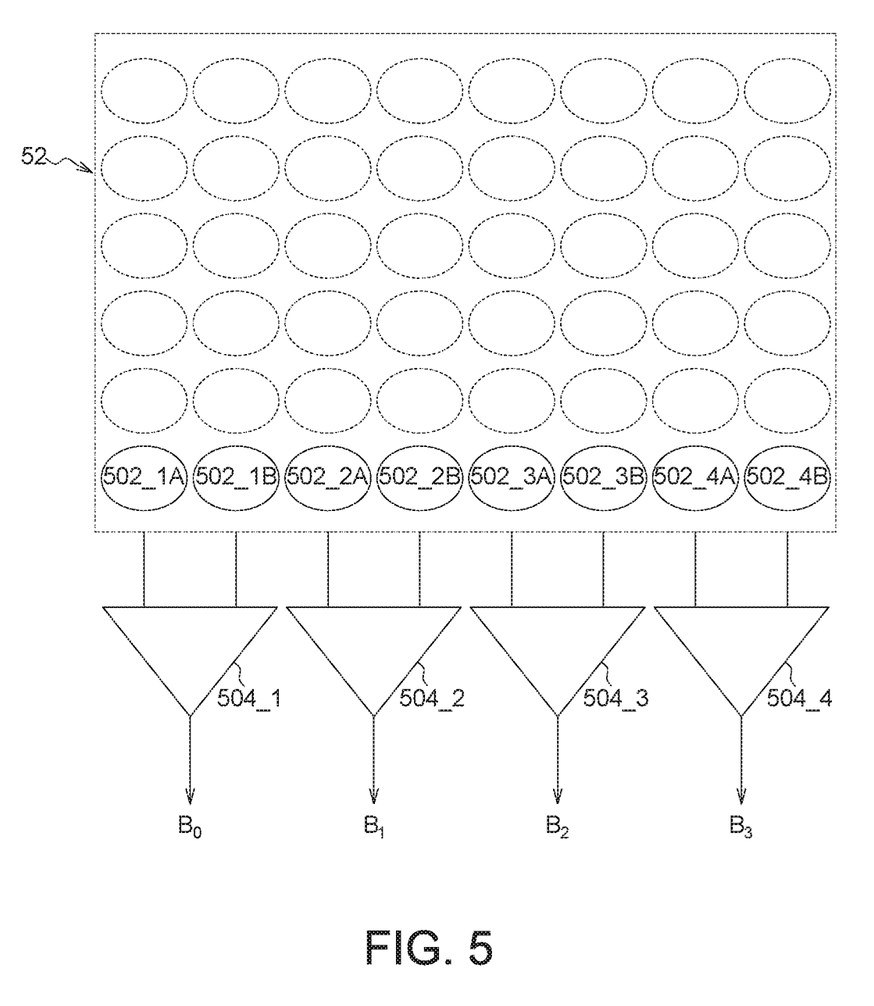
FIG. 5 illustrates an example configuration of source memory cells.

FIG. 5 illustrates an example configuration of source memory cells.

In this example, the source memory cells are arranged in a specific grouped region of the memory array to simplify the design. For example, the source memory cells are arranged in the same word line, in the same bit line or in a mini-array . . . etc.

As shown in FIG. 5, the source memory cells 502_1A, 502_1B, 502_2A, 502_2B, 502_3A, 502_3B, 502_4A and 502_4B are grouped in a word line at the bottom of the memory array 52.

In the example of FIG. 5, the inherent information includes 4 bits $B_0$-$B_3$, wherein the bit value of the bit $B_0$ is generated from the comparator 504_1 coupled to the source memory cells 502_1A and 502_1B; the bit value of the bit $B_1$ is generated from the comparator 504_2 coupled to the source memory cells 502_2A and 502_2B; the bit value of the bit $B_2$ is generated from the comparator 504_3 coupled to the source memory cells 502_3A and 502_3B; the bit value of the bit $B_3$ is generated from the comparator 504_4 coupled to the source memory cells 502_4A and 502_4B.

Figure 6:
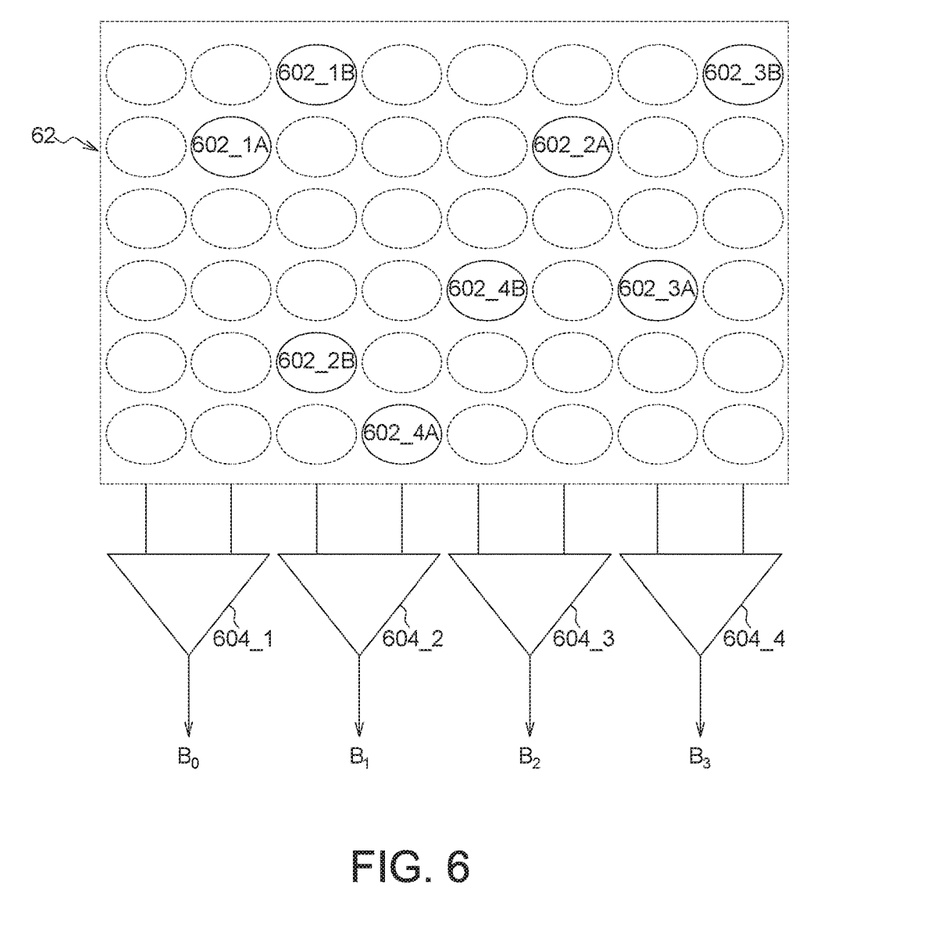
FIG. 6 illustrates another example configuration of source memory cells.

FIG. 6 illustrates another example configuration of source memory cells.

In this example, the source memory cells are arranged discretely across the memory array to increase the difficulty to trace the codeword of the inherent information.

As shown in FIG. 6, the source memory cells 602_1A, 602_1B, 602_2A, 602_2B, 602_3A, 602_3B, 602_4A and 602_4B are arranged discretely across the memory array 62, rather than in a specific grouped region.

Each of the comparators 604_1, 604_2, 604_3 and 604_4 can connect to the corresponding pair of source memory cells through a properly designed metal wiring. In this example, the bit value of the bit $B_0$ of the inherent information is generated from the comparator 604_1 coupled to the source memory cells 602_1A and 602_1B; the bit value of the bit $B_1$ of the inherent information is generated from the comparator 604_2 coupled to the source memory cells 602_2A and 602_2B; the bit value of the bit $B_2$ of the inherent information is generated from the comparator 604_3 coupled to the source memory cells 602_3A and 602_3B; the bit value of the bit $B_3$ of the inherent information is generated from the comparator 604_4 coupled to the source memory cells 602_4A and 602_4B.

The present disclosure provides devices and methods for generating inherent information of an integrated circuit. Each bit value of the inherent information can be generated by comparing the electrical parameter values of two source memory cells, so that the generated inherent information is unique, difficult to predict and stable, and is suitable for security applications such as encryption and authentication operations.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An inherent information generating device, adapted to an integrated circuit, comprising:
   a plurality of pairs of source memory cells, wherein one of the pairs of source memory cells comprises:
   a first source memory cell with a first electrical parameter value; and
   a second source memory cell with a second electrical parameter value;
   a comparison circuit, coupled to the pairs of source memory cells and configured to generate inherent information of the integrated circuit, comprising:
   a first comparator, coupled to the first and second source memory cells, configured to compare the first electrical parameter value with the second electrical parameter value, and generate a bit value of a first bit of the inherent information according to a comparison result; and
   a controller, coupled to the pairs of source memory cells and the comparison circuit, configured to perform a programming operation on at least one of the first and second source memory cells to increase a difference between the first and second electrical parameter values.

2. The inherent information generating device according to claim 1, wherein the controller performs the programming operation on the first source memory cell to increase the first electrical parameter value when the first electrical parameter value is larger than the second electrical parameter value.

3. The inherent information generating device according to claim 1, wherein the controller performs the programming operation on the second source memory cell to decrease the second electrical parameter value when the first electrical parameter value is larger than the second electrical parameter value.

4. The inherent information generating device according to claim 1, wherein the controller performs the programming operation on the first source memory cell and the second source memory cell to increase the first electrical parameter value and to decrease the second electrical parameter value when the first electrical parameter value is larger than the second electrical parameter value.

5. The inherent information generating device according to claim 1, further comprising:
   an output memory cell; and
   a controller, coupled to the comparison circuit and the output memory cell, configured to program the bit value of the first bit of the inherent information into the output memory cell according to the comparison result generated by the first comparator.

6. The inherent information generating device according to claim 1, wherein the first and second source memory cells are in an initial state that the first and second source memory cells have not been processed by a programming operation or an erasing operation.

7. The inherent information generating device according to claim 1, wherein the first and second source memory cells are in a programmed state that the first and second source memory cells have been processed by a programming operation.

8. The inherent information generating device according to claim 1, wherein another one of the pairs of source memory cells comprises:
   a third source memory cell with a third electrical parameter value; and
   a fourth source memory cell with a fourth electrical parameter value; and
   the comparison circuit further comprises:
   a second comparator, coupled to the third and fourth source memory cells, configured to compare the third electrical parameter value with the fourth electrical parameter value to generate the bit value of a second bit of the inherent information.

9. The inherent information generating device according to claim 8, wherein the third source memory cell is the first source memory cell or the second source memory cell.

10. An inherent information generating method, adapted to an integrated circuit, comprising:
    providing a plurality of pairs of source memory cells, wherein one of the pairs of source memory cells comprises a first source memory cell with a first electrical parameter value and a second source memory cell with a second electrical parameter value;
    comparing the first electrical parameter value with the second electrical parameter value, and generating a bit value of a first bit of the inherent information according to a comparison result; and
    performing a programming operation on at least one of the first and second source memory cells to increase a difference between the first and second electrical parameter values.

11. The inherent information generating method according to claim 10, further comprising:
    performing the programming operation on the first source memory cell to increase the first electrical parameter value when the first electrical parameter value is larger than the second electrical parameter value.

12. The inherent information generating method according to claim 10, further comprising:
    performing the programming operation on the second source memory cell to decrease the second electrical parameter value when the first electrical parameter value is larger than the second electrical parameter value.

13. The inherent information generating method according to claim 10, further comprising:
    performing the programming operation on the first source memory cell and the second source memory cell to increase the first electrical parameter value and to decrease the second electrical parameter value when the first electrical parameter value is larger than the second electrical parameter value.

14. The inherent information generating method according to claim 10, further comprising:
    programming the bit value of the first bit of the inherent information into an output memory cell according to the comparison result of the first and second electrical parameter values.

15. The inherent information generating method according to claim 10, wherein the first and second source memory cells are in an initial state that the first and second source memory cells have not been processed by a programming operation or an erasing operation.

16. The inherent information generating method according to claim 10, wherein the first and second source memory cells are in a programmed state that the first and second source memory cells have been processed by a programming operation.

17. The inherent information generating method according to claim 10, wherein another one of the pairs of source memory cells comprises a third source memory cell with a third electrical parameter value and a fourth source memory cell with a fourth electrical parameter value, and the inherent information generating method further comprises:
    comparing the third electrical parameter value with the fourth electrical parameter value to generate the bit value of a second bit of the inherent information.

18. The inherent information generating method according to claim 17, wherein the third source memory cell is the first source memory cell or the second source memory cell.

* * * * *